United States Patent [19]

Crossett, III et al.

[11] 4,449,222

[45] May 15, 1984

[54] DIGITAL MODULATION QUALITY MONITOR

[75] Inventors: Joseph A. Crossett, III, Richardson; Paul R. Hartmann, Allen, both of Tex.

[73] Assignee: Rockwell International Corporation, El Segundo, Calif.

[21] Appl. No.: 324,166

[22] Filed: Nov. 23, 1981

[51] Int. Cl.³ .............................................. H03K 13/32
[52] U.S. Cl. ....................................... 375/10; 375/39; 329/112
[58] Field of Search ........................ 375/10, 39, 53, 80, 375/86, 42; 364/481; 370/13, 17, 20; 371/3, 48; 455/60; 329/112

[56] References Cited

U.S. PATENT DOCUMENTS

| | | | |
|---|---|---|---|
| 3,341,776 | 9/1967 | Doelz | 375/39 |
| 3,588,349 | 6/1971 | Kawai | 375/53 |
| 3,761,825 | 9/1973 | Hill | 375/10 |
| 4,095,187 | 6/1978 | Yoshida | 375/17 |
| 4,317,206 | 2/1982 | Nossen | 375/10 |

*Primary Examiner*—Robert L Griffin
*Assistant Examiner*—Stephen Chin
*Attorney, Agent, or Firm*—Michael E. Taken; V. Lawrence Sewell; H. Fredrick Hamann

[57] ABSTRACT

A quality monitoring technique and detector is provided for checking the accuracy of modulation performed by a digital transmitter. The monitoring is performed without using a full receiver nor otherwise fully demodulating the signal to recover the baseband data. The modulated signal output by the transmitter is partially demodulated to a partial signal set on a single dimension of a two dimensional modulated signal matrix. The baseband signal is translated in accordance with a predetermined mapping format into the partial signal set on the single dimension for correlation against the partially demodulated signal. Failure to correlate indicates an error.

13 Claims, 4 Drawing Figures

QUALITY MONITOR
PARTIAL SIGNAL SET

QUALITY MONITOR
PARTIAL SIGNAL SET

DIGITAL MODULATION QUALITY MONITOR

TECHNICAL FIELD

The invention relates to digital modulation of a carrier signal with a baseband signal, and more particularly to an apparatus and method for detecting whether the modulation has been properly performed without fully demodulating the transmitter output, i.e., without recovering the baseband data.

BACKGROUND

In a digital transmission system, there is a need to monitor the quality of the signal transmitted. The monitor should indicate whether or not the quality of the modulated signal as it leaves the transmitter is sufficient to be processed by a distant receiver in an error free manner. If the quality factor is not high enough, then corrective action can be taken or stand-by equipment can be switched on line to protect the data.

One way of providing quality monitoring is by using a full receiver at the transmit terminal for fully demodulating the transmitted signal back to baseband to recover the data. The use of a receiver is cumbersome and expensive. For example, in the case of quadrature phase shift keyed modulation (QPSK), the receiver has a pair of phase detectors, one for each quadrature demodulation axis, and the appropriate data processing and coordinating circuitry therebetween, in addition to carrier recovery circuitry and clock recovery circuitry. Furthermore, because of the ambiguity in establishing the 0° reference phase of the recovered carrier, the signal may be differentially encoded for sending the differences in phase rather than absolute phase position to carry the data, and hence decoding circuitry is needed. Still further, the reliability of the monitoring receiver is the same order or less than the transmitter and hence detracts from the overall system reliability.

Another known monitoring technique involves the use of activity monitoring equipment on the digital baseband. Activity monitors are simple and reliable; however, they do not monitor the quality of the modulated signal, but rather only whether or not there is any data activity on the baseband (i.e., transitions from logic 1 to logic 0). These activity monitors do not provide any indication of whether or not the carrier signal has been properly modulated.

SUMMARY

The present invention provides a system for monitoring the quality of a modulated signal without using a full receiver nor otherwise resorting to full demodulation. The system of the present invention monitors modulation accuracy in a particularly simple and efficient manner.

The modulated output of a digital transmitter is partially demodulated by a single demodulator. The baseband signal is processed through a predetermined signal set transformation for correlation against the partially demodulated signal. Failure to correlate indicates an error. In one desirable aspect of the invention, the single demodulator may be identical to any of the plurality of demodulators previously used. In preferred form, the predetermined signal set translation of the baseband data is performed by a dedicated logic array, look-up memory table, or the like.

DETAILED DESCRIPTION

Figure 1:
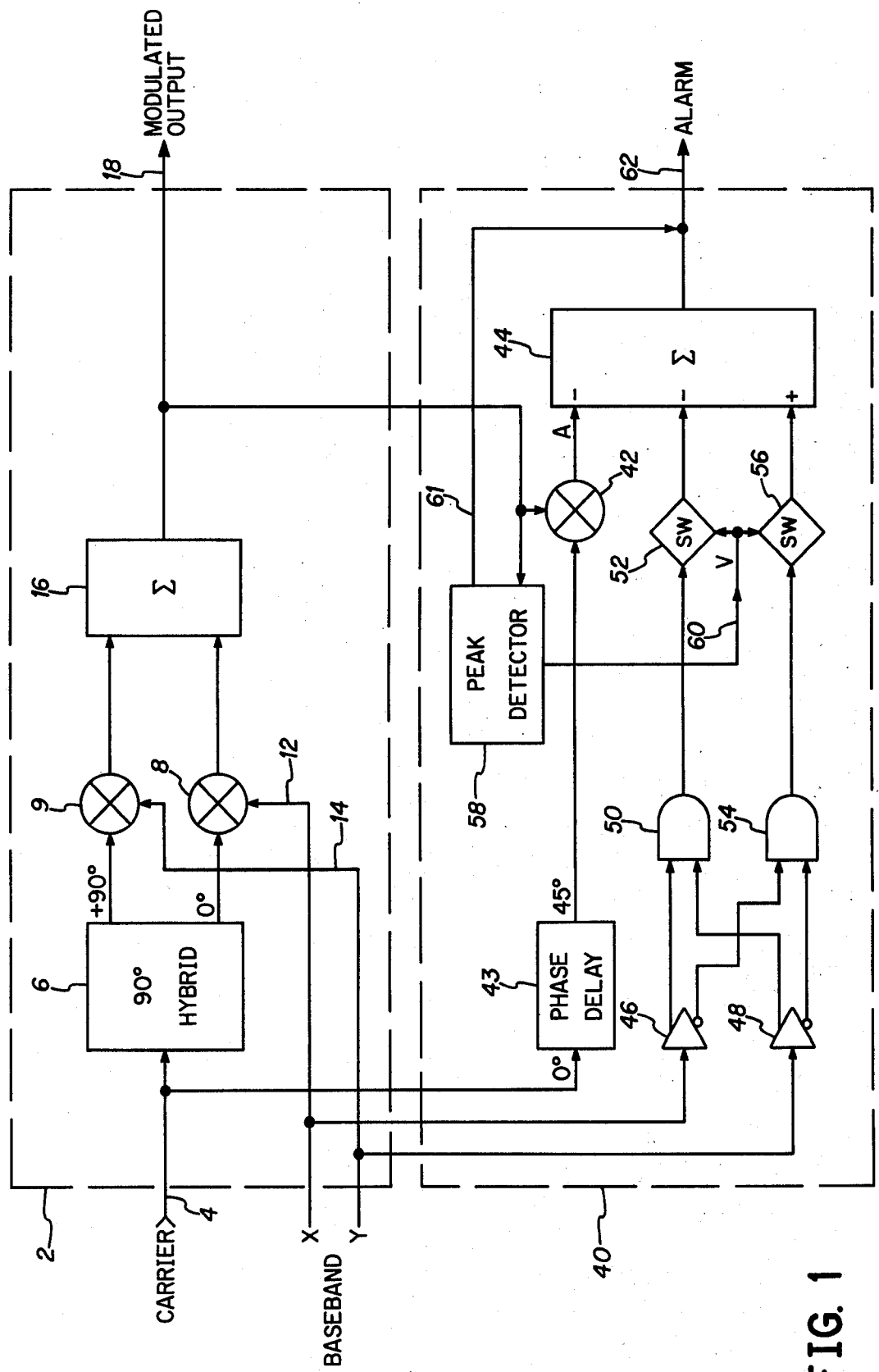
FIG. 1 is a schematic illustration of a known digital transmitter in combination with a monitoring system constructed in accordance with the invention.

FIG. 1 shows in dashed box 2 a standard digital transmitter known in the art. A carrier signal on line 4 is split in quadrature phase by hybrid 6 for delivery to biphase modulators 8 and 9 which phase modulate the carrier with the baseband data X and Y of the baseband signal on lines 12 and 14. The modulated quadrature components are added in summer 16 which yields the modulated output signal on line 18.

There are many forms of digital carrier modulation. One form is quadrature phase shift keying (QPSK), an example of which is shown in FIG. 2 wherein a data value for X and Y of 00 is represented by a 45° phase value at point 22, 01 is represented by a 135° phase value at point 28, 11 is represented by a 225° phase value at point 32, and 10 is represented by a 315° phase value at point 26.

Figure 2:
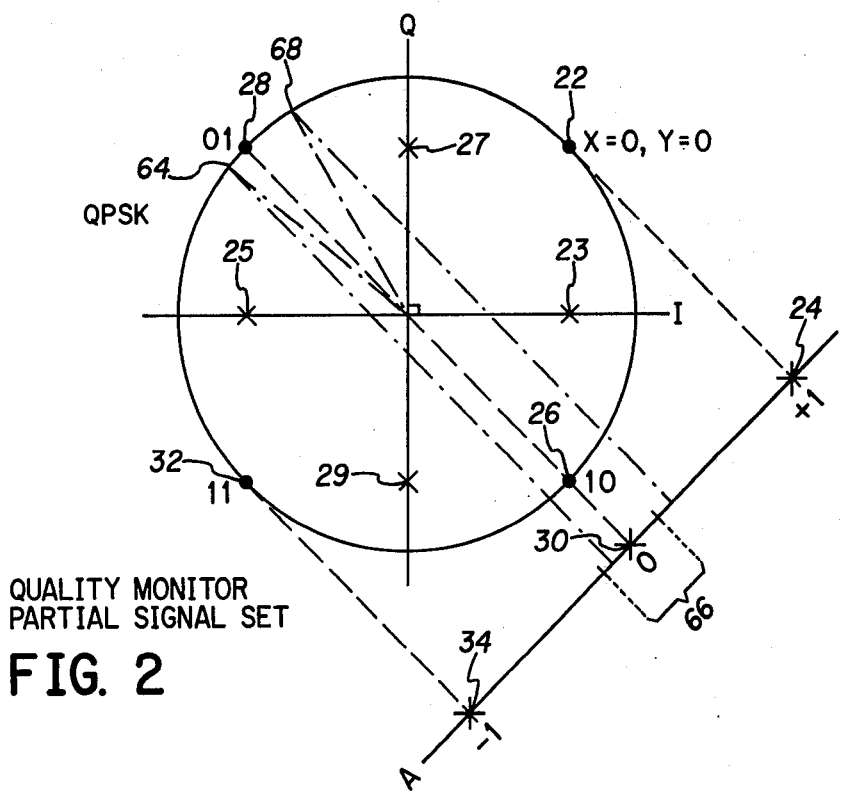
FIG. 2 shows a QPSK modulated output signal set and the partial demodulation thereof to one of its demodulation axes.

In order to check the accuracy of the modulation performed by transmitter 2, the QPSK signal set of FIG. 2 may be fully demodulated by a receiver having a pair of demodulators or phase detectors which are identical to modulators 8 and 9. Each demodulator would have one of its inputs supplied by the modulated signal on line 18 and its other input supplied by a local oscillator signal of the same frequency or by the recovered carrier signal. One of the demodulators has its local oscillator signal or recovered carrier signal shifted by 90° so as to provide a demodulation axis perpendicular to the demodulation axis of the other demodulator. For example, in FIG. 2 one of the demodulators or phase detectors will demodulate the QPSK signal set along axis or dimension I, with points 22 and 26 in the QPSK signal set yielding point 23 on axis I, and points 32 and 28 in the QPSK signal set yielding point 25 on axis I. The other demodulator, having the 90° shifted local oscillator or carrier signal applied thereto, demodulates the QPSK signal set along an axis or dimension Q perpendicular to axis I, with points 22 and 28 in the QPSK set yielding point 27 on axis Q, and points 32 and 26 in the QPSK signal set yielding point 29 on axis Q. This full demodulation requires coordinating and processing circuitry between the phase detectors for intelligent decision making in resolving the points of the signal matrix.

The present invention provides a monitoring system 40 shown in dashed box in FIG. 1. The modulated output signal from line 18 of the transmitter is supplied to a single demodulator or phase detector 42 identical to those above described. The other input to demodulator 42 is supplied from the carrier signal on line 4. Single demodulator 42 partially demodulates the output signal to a given demodulation axis, such as axis I or axis Q or any other demodulation axis. For example, in preferred form a demodulation axis A is chosen which lies along a 45° angle relative to axes I and Q. This demodulation axis A is provided by the circuitry of FIG. 1 by routing the carrier signal from line 4 through a 45° phase delay 43. Any other demodulation axis may of course be chosen according to the angle of phase delay. For example, demodulation axis Q may be provided by a 90° phase delay; and demodulation axis I may be provided by a 0° phase delay.

Single demodulator 42 partially demodulates the output signal to demodulation axis A, in comparable manner to that above described for axis I and for axis Q. Point 22 in the QPSK signal set yields point 24 on axis A. Points 26 and 28 in the QPSK signal set yield point 30 on axis A. Point 32 in the QPSK signal set yields point 34 on axis A. This partial demodulation to one of two demodulation axes or dimensions yields the quality monitor signal set composed of point 34 having a normalized amplitude voltage level of −1, point 30 having a voltage level 0, and point 24 having a normalized voltage level of +1. The designated level is entered into a summer 44, FIG. 1, and subtracted from the contents thereof.

The baseband signal data values on lines 12 and 14 are supplied to translating means which translate the baseband signal in accordance with a predetermined mapping format to the partial signal set on axis A of FIG. 2 for correlation against the partially demodulated signal. The baseband signal X and Y data values on lines 12 and 14 are supplied to gates 46 and 48, respectively. The true output of gate 46 and the true output of gate 48 are delivered to AND gate 50 whose output in turn is delivered to switch 52. The inverted output of gate 46 and the inverted output of gate 48 are delivered to AND gate 54 whose output in turn is delivered to switch 56. The modulated output on line 18 is delivered to a peak detector 58 which generates output normalized reference value voltage V, e.g., equal to 1, on line 60 to each of the switches 52 and 56.

In operation, if both X and Y are zero, as shown at point 22 in FIG. 2, then the inverted output of gate 46, FIG. 1, goes high and the inverted output of gate 48 goes high whereby both inputs to AND gate 54 are high. The output of AND gate 54 then goes high which turns on switch 56 to allow analog voltage V to pass therethrough to summer 44 and be added to the contents thereof. This latter entry provides a voltage value of +1 in summer 44. Since the projection from point 22 on axis A is a +1 value at point 24, demodulator 42 provides a voltage value of +1 to summer 44 to be subtracted from the latter's contents. Summer 44 thus adds the value of 1 from switch 56 and subtracts the value of 1 from demodulator 42, whereby to provide an output of zero on line 62. A value of zero on line 62 indicates no error.

If X and Y are both 1, as shown at point 32 in FIG. 2, then the true outputs of gates 46 and 48, FIG. 1, are both high to cause the output of AND gate 50 to go high which in turn activates switch 52 to an on condition allowing analog voltage V to pass therethrough to summer 44 and be subtracted from the contents thereof. The projection from point 32 in FIG. 2 to the A axis is at point 34 which is a −1 value. This −1 value from demodulator 42 is subtracted from the −1 value supplied from switch 52 which again yields an output of zero on line 62, indicating no error.

If X is 0 and Y is 1, as shown at point 28 in FIG. 2, then the true output of gate 46 is low which in turn disables AND gate 50, and the inverted output of gate 48 is low which in turn disables AND gate 54. Since the outputs of AND gates 50 and 54 are each low, neither of switches 52 or 56 is activated and hence each of these switches provides a value of zero to summer 44. Point 28, FIG. 2, projects to point 30 on axis A having a value zero. This zero voltage level from demodulator 42 is subtracted from the contents of summer 44, which contents are zero because of the zero input from each of switches 52 and 56, thus giving an output of zero on line 62, again indicating no error. Operation is comparable for the data value 10, as shown at point 26 in FIG. 2.

If the modulation performed by transmitter 2 is inaccurate, then a value other than zero will appear on output alarm line 62. For example if X=0 and Y=0 is modulated to a point other than 22 in FIG. 2, then the partial demodulation will yield a point other than point 24 on axis A which in turn results in a voltage value other than +1 being entered into summer 44 from demodulator 42. Switch 56 will supply a +1 voltage value to the summer and the net result on line 62 will be other than zero.

A certain theshold margin of error may be provided by allowing a given window around zero on output line 62. For example, a certain amount of phase rotation is tolerable as shown at 64 in FIG. 2. This small amount of phase rotation will project within a given window 66 as schematically shown on axis A. However, a larger amount of phase rotation as shown at 68 projects and falls outside of window 66 and will be designated as an error. While a dedicated logic array has been shown as the baseband signal processing or translating means for mapping the baseband signal in predetermined manner onto the partial signal set on axis A, other mapping means may be used, such as a look-up table in memory or the like. As aforenoted, the carrier signal from line 4 is supplied to phase detector 42 with a 45° phase change to yield demodulation axis A. A different relative phase change may of course be provided to yield a different demodulation axis or dimension.

Peak detector 58 also senses a loss of output on line 18 when the level thereof does not rise above the peak detector threshold. This in turn may be used as an alarm condition sent over line 61 to the alarm output 62.

Figure 3:
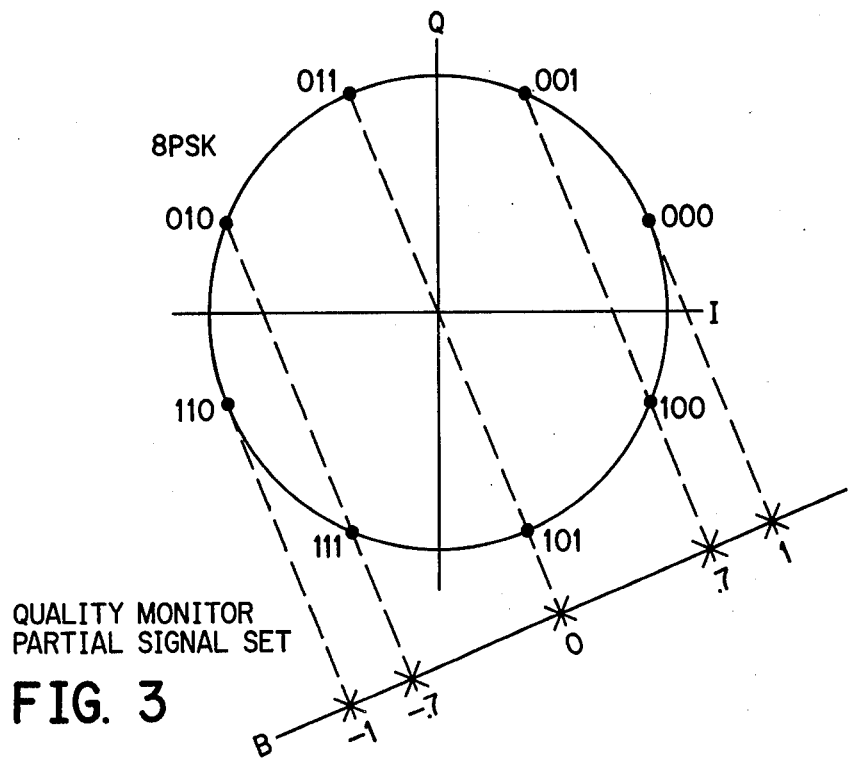
FIG. 3 shows an 8 PSK modulated output signal set and the partial demodulation thereof to one of its demodulation axes.
Figure 4:
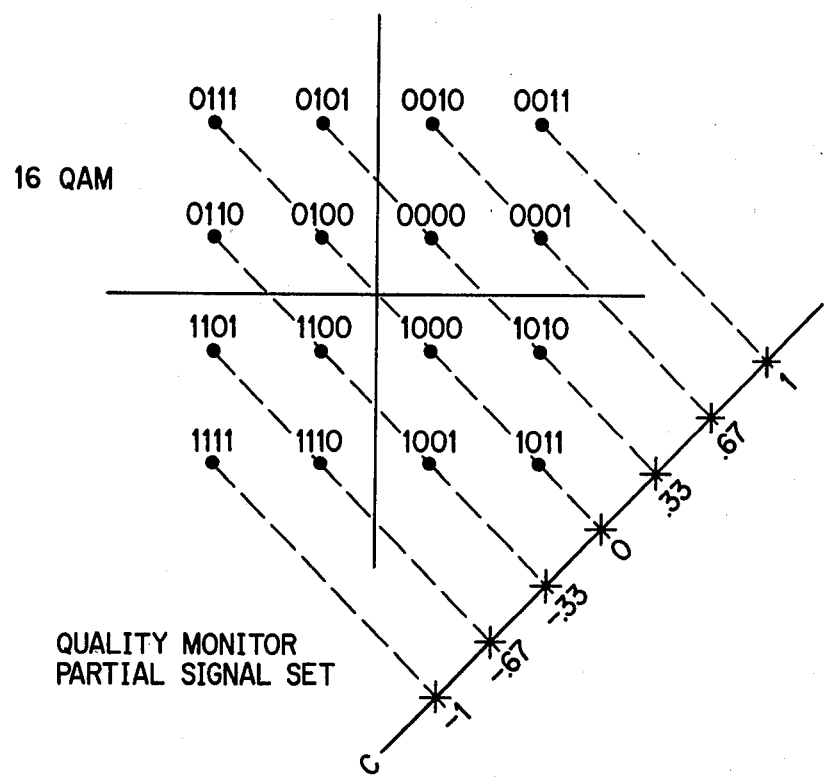
FIG. 4 shows a 16 QAM modulated output signal set and the partial demodulation thereof to one of its demodulation axes.

The system of the invention is of course applicable to other types of digital modulation. FIG. 3 shows an 8 PSK signal set output from an 8 PSK digital transmitter. Instead of using a full receiver with two demodulators and all the attendent circuitry for correlation and the like, the signal set is partially demodulated onto a given demodulation axis or dimension by a single demodulator, and the baseband signal is mapped onto the partially demodulted signal set on the given demodulation axis. The single demodulator is fed by the output of the 8 PSK transmitter and by the carrier signal to generate the quality monitor partial signal set on given axis B which values are fed to summer 44 as in FIG. 1. The baseband signal may be translated or mapped onto axis B by a dedicated logic array as in FIG. 1, or by a look-up table or the like. FIG. 4 shows a 16 QAM modulated signal set output by a 16 QAM digital transmitter. As above, this signal set may be partially demodulated by a single demodulator to yield a quality monitor partial signal set along a given axis or dimension C as shown. The baseband signal is mapped onto this axis for correlation thereagainst by dedicated logic means, or a look-up table, etc., as above. The invention is of course applicable to full and partial response systems.

In the present invention, there is no need to fully demodulate the output signal set, nor to resolve the ambiguity between the non-unique signal points 28 and 26, FIG. 2, when projected onto axis A at point 30. This is because the invention enables the quality or accuracy of the modulation performed by the transmitter to be monitored without recovering the baseband data.

It is recognized that various modifications are possible within the scope of the appended claims.

We claim:

1. In modulation of a carrier signal with a digital baseband signal, a technique for quality monitoring the modulated signal without full demodulation comprising:
   partially demodulating said modulated signal so as to yield a partial signal set related to the set of baseband signal values by a predetermined mapping between the members thereof and the members of the partial signal set, said partial signal set having fewer members than the baseband signal set; and
   translating said baseband signal, in accordance with said mapping, providing translated signal values corresponding to members of said partial signal set, for correlation against said signal which has been partially demodulated.

2. The invention according to claim 1, wherein:
   said carrier signal is digitally modulated in quadrature, the values of the modulated signal being representable in a two dimensional space defined by two axes;
   said modulated signal is partially demodulated such that said members of the partial signal set lie on a single axis in said space; and
   said baseband signal is translated onto said single axis in accordance with said predetermined mapping for correlation against said partially demodulated signal, wherein failure to correlate indicates an error.

3. The invention according to claim 2 wherein said partial signal set on said single axis includes one or more non-unique points.

4. A technique for checking the quality of modulation of a modulated signal having a two dimensional signal matrix without recovering the modulating baseband data, comprising:
   partially demodulating said modulated signal to a single dimension of the two dimensional modulated signal matrix; and
   mapping said baseband data in accordance with a predetermined format onto said single dimension for correlation against said signal which has been partially demodulated.

5. For use with a digital transmitter having a plurality of modulators for modulating a carrier signal with a baseband signal, the improvement comprising quality monitor detector means for checking the quality of modulation without a full receiver, comprising:
   demodulator means for partially demodulating said modulated signal so as to yield a partial signal set related to the set of baseband signal values by a predetermined mapping between the members thereof and the members of the partial signal set, said partial signal set having fewer members than the baseband signal set; and
   baseband signal processing means for translating said baseband signal in accordance with said mapping, providing translated signal values corresponding to members of said partial signal set, for comparison against said signal which has been partially demodulated.

6. The invention according to claim 5 wherein:
   said improvement can be used with a transmitter in which said carrier signal is modulated in quadrature by said baseband signal and summed for transmission;
   said demodulator means demodulates said transmitted modulated signal to one of a plurality of demodulation axes; and
   said baseband signal processing means translates said baseband signal onto said one axis.

7. For use with a digital transmitter having a plurality of modulators for modulating a carrier signal with a baseband signal into a matrix of two dimensions, defining a modulated signal space, the improvement comprising quality monitor detector means for checking the quality of modulation without a full receiver otherwise requiring a plurality of demodulators, said improvement comprising:
   demodulator means for partially demodulating said signal which has been modulated, to a partial signal set on a single dimension in said space; and
   baseband signal processing means for mapping said baseband signal in a predetermined manner onto said single dimension for comparison against said signal which has been partially demodulated.

8. The invention according to claim 7 wherein:
   said demodulator means comprises a demodulator having one input supplied by the modulated signal output by said transmitter and having another input supplied by said carrier signal, and outputting values in said partial signal set along said single dimension;
   said baseband signal processing means has an input supplied by said baseband signal and includes means selectively gating given reference values to an output thereof in accordance with baseband signal data; and
   said baseband signal processing means further comprises comparing means receiving the outputs of said demodulator and said selective gating means for comparing the value on said single dimension of said partially demodulated signal against the selectively gated said reference value.

9. The invention according to claim 8 wherein:
   said baseband signal processing means comprises another input receiving the modulated signal output from said transmitter through normalizing means furnishing a reference level to said selective gating means, which reference level is selectively gated to said comparator means in accordance with said baseband signal data and said mapping in a predetermined manner.

10. The invention according to claim 9 wherein:
    said comparator means comprises summing means having a first input from said demodulator, and second and third inputs from said selective gating means, said inputs having predetermined polarities for designating addition or subtraction in a sum computed by said summing means.

11. The invention according to claim 9 wherein:
    said selective gating means comprises a plurality of switches each having a reference level input from said normalizing means, and each having an output to said comparing means, each switch selectively passing said reference level therethrough to said comparing means or blocking said passage as dictated by said mapping for said baseband signal data.

12. The invention according to claim 11 wherein said normalizing means comprises a voltage peak detector receiving said modulated signal output by said transmitter and outputting said reference level to said switches.

13. The invention according to claim 11 wherein said baseband signal processing means comprises a dedicated logic array receiving said baseband signal and selectively outputting respective activating signals to said switches.

* * * * *